(12) United States Patent
Behres (10) Patent No.: US 9,080,237 B2
(45) Date of Patent: Jul. 14, 2015

(54) LAYER DEPOSITING DEVICE AND METHOD FOR OPERATING IT

(75) Inventor: Alexander Behres, Pfatter (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 909 days.

(21) Appl. No.: 12/240,270

(22) Filed: Sep. 29, 2008

(65) Prior Publication Data

US 2009/0117272 A1    May 7, 2009

(30) Foreign Application Priority Data

Sep. 28, 2007 (DE) .......... 10 2007 046 606
Feb. 20, 2008 (DE) .......... 10 2008 010 041

(51) Int. Cl.
| | |
|---|---|
| C23C 16/44 | (2006.01) |
| C23C 16/54 | (2006.01) |
| C23C 16/455 | (2006.01) |
| C23C 16/458 | (2006.01) |
| C23C 14/50 | (2006.01) |
| C23C 16/30 | (2006.01) |
| C30B 25/08 | (2006.01) |
| C30B 25/12 | (2006.01) |
| C30B 25/14 | (2006.01) |

(52) U.S. Cl.
CPC ......... *C23C 16/45551* (2013.01); *C23C 14/505* (2013.01); *C23C 16/301* (2013.01); *C23C 16/306* (2013.01); *C23C 16/4584* (2013.01); *C30B 25/08* (2013.01); *C30B 25/12* (2013.01); *C30B 25/14* (2013.01)

(58) Field of Classification Search
CPC ............ C23C 14/505; C23C 16/45551; C23C 16/4584
See application file for complete search history.

(56) References Cited

U.S. PATENT DOCUMENTS

| | | | | |
|---|---|---|---|---|
| 5,338,362 | A | | 8/1994 | Imahashi |
| 5,366,555 | A | * | 11/1994 | Kelly .............................. 118/719 |
| 5,730,802 | A | | 3/1998 | Ishizumi et al. |
| 6,153,012 | A | | 11/2000 | Rupp et al. |
| 6,444,027 | B1 | | 9/2002 | Yang et al. |
| 6,576,062 | B2 | | 6/2003 | Matsuse |
| 2001/0002279 | A1 | | 5/2001 | Forrest et al. |
| 2001/0007244 | A1 | * | 7/2001 | Matsuse ........................ 118/719 |
| 2001/0037761 | A1 | | 11/2001 | Ries et al. |
| 2002/0100418 | A1 | | 8/2002 | Sandhu et al. |
| 2004/0052972 | A1 | | 3/2004 | Schmitt |
| 2004/0187784 | A1 | | 9/2004 | Sferlazzo |
| 2006/0013954 | A1 | | 1/2006 | Chiu |
| 2006/0040055 | A1 | | 2/2006 | Nguyen et al. |
| 2006/0124062 | A1 | | 6/2006 | Nagai |
| 2007/0095286 | A1 | * | 5/2007 | Baek et al. ..................... 118/719 |

(Continued)

FOREIGN PATENT DOCUMENTS

| | | |
|---|---|---|
| DE | 101 41 084 | 11/2002 |
| DE | 10 2004 056 170 A1 | 3/2006 |

(Continued)

*Primary Examiner* — Parviz Hassanzadeh
*Assistant Examiner* — Nathan K Ford
(74) *Attorney, Agent, or Firm* — Cozen O'Connor (57) ABSTRACT

A layer depositing device comprises a chamber (10) having a substrate carrier (12) for receiving at least one substrate (13) to be coated, and a process gas space (11), comprising a partition (23) that separates a first segment (21) of the process gas space (11) from a second segment (22) of the process gas space (11). The layer depositing device has a device (44) for moving the substrate (13) relative to the partition (23).

14 Claims, 5 Drawing Sheets

(56) References Cited

U.S. PATENT DOCUMENTS

| | | |
|---|---|---|
| 2007/0218702 A1 | 9/2007 | Shimizu et al. |
| 2008/0096369 A1 | 4/2008 | Strzyzewski et al. |
| 2008/0193643 A1* | 8/2008 | Dip .................... 427/255.5 |

FOREIGN PATENT DOCUMENTS

| | | |
|---|---|---|
| EP | 0 387 892 | 9/1990 |
| EP | 0 683 249 | 11/1995 |
| JP | 05-254985 | 10/1993 |
| JP | 5-343327 | 12/1993 |
| JP | 06-204147 | 7/1994 |
| JP | 07-321045 | 12/1995 |
| JP | 10-072281 | 3/1998 |
| JP | 2004-522294 | 7/2004 |
| JP | 2007-247066 | 9/2007 |
| WO | WO 01/86034 | 11/2001 |
| WO | WO 2004/094692 | 11/2004 |
| WO | WO 2006/015915 | 2/2006 |
| WO | WO 2006/065014 | 6/2006 |

* cited by examiner

LAYER DEPOSITING DEVICE AND METHOD FOR OPERATING IT

RELATED APPLICATIONS

This patent application claims the priority of German patent applications DE 10 2007 046 606.6 filed Sep. 28, 2007 and DE 10 2008 010 041.2 filed Feb. 20, 2008, the disclosure contents of both of which are hereby incorporated by reference.

FIELD OF THE INVENTION

The present invention relates to a layer depositing device and a method for operating a layer depositing device.

BACKGROUND OF THE INVENTION

During the deposition of a layer in a layer depositing device, the process gases required for producing the layer are usually conducted simultaneously steadily over a substrate to be coated. This can lead to preliminary reactions in the gas phase. The preliminary reactions produce particles in a process gas space which can become arranged on the substrate.

Document U.S. Pat. No. 6,576,062 B2 is concerned with a layer depositing device comprising a first and a second gas feed.

SUMMARY OF THE INVENTION

It is an object of the invention to provide a layer depositing device and a method for operating a layer depositing device which reduce a preliminary reaction of process gases.

In one embodiment, a layer depositing device has a chamber. The chamber comprises a substrate carrier for receiving a substrate to be coated, and a process gas space. The process gas space has a first and a second segment and also a partition. The partition separates the first segment and the second segment from one another. The layer depositing device furthermore comprises a device for moving the substrate relative to the partition.

The partition is advantageously arranged between the first segment and the second segment, such that it is possible to set first process conditions in the first segment independently of second process conditions in the second segment. Preliminary reactions of process gases are thus reduced. In this case, a gas is also understood to mean a plasma. In one embodiment, the substrate carrier can be moved relative to the partition by means of the device for moving the substrate. The substrate carrier can be moved in such a way that the substrate to be coated can be moved from the first segment into the second segment, such that the substrate can be coated alternately and successively by means of the first and the second process conditions.

In one embodiment, the chamber comprises a first gas feed into the first segment and a second gas feed into the second segment. Advantageously, the first and the second gas feed can be used to introduce a first process gas into the first segment and a second process gas into the second segment. The first and the second process gas are preferably different. The partition separates the first segment from the second segment in such a way that the first process gas advantageously does not mix with the second process gas, with the result that preliminary reactions of the two process gases are avoided.

In one embodiment, the layer depositing device is embodied for chemical vapor deposition, abbreviated to CVD. The layer depositing device is preferably realized as an epitaxial layer depositing device. The layer depositing device can be realized for an atomic layer epitaxy method. The layer depositing device can therefore be used for depositing compound semiconductors. In this case, by way of example, an atomic layer of a first component of the compound semiconductor can be deposited in the first segment and an atomic layer of a second component of the compound semiconductor can be deposited in the second segment. Preferably, the substrate is situated multiply alternately in the first segment and in the second segment, with the result that a layer having a multiplicity of atomic layers can be deposited.

In one embodiment, the substrate carrier is embodied as a circular plate. The circular plate has an axis of rotational symmetry. The substrate carrier and the process gas space are arranged such that they can be rotated relative to one another. In this case, an axis of rotation of the relative movement can be the axis of rotational symmetry of the plate. Preferably, the substrate is arranged outside the axis of rotational symmetry of the plate and thus outside the axis of rotation.

In one embodiment, the substrate carrier is designed for receiving a plurality of substrates to be coated.

In one embodiment, the substrate carrier is embodied as a gas cushion composed of the process gas or a carrier gas, on which the at least one substrate floats. The gas cushion can be embodied in such a way that the at least one substrate is caused to effect a rotational movement.

In one embodiment, the process gas space is substantially cylindrical. Preferably, the partition runs through a center axis of the cylinder. The center axis can be the axis of rotation. The partition can be embodied substantially as a rectangle. As an alternative, the partition comprises one or more rectangles. The partition can be embodied as a mechanical partition. The partition can be realized as a solid. The partition can contain a gas-impermeable material. A material of the partition can be heat-resistant. The material can be thermally stable up to a temperature of 1000 degrees Celsius. As an alternative, the material can be thermally stable up to a temperature of 2000 degrees Celsius. The material can be porous. The material can contain ceramic, high-grade steel or molybdenum.

In one embodiment, the partition divides the cylindrical process gas space in such a way that the first segment and the second segment have an identical size. In an alternative embodiment, the first segment and the second segment have different sizes.

In one development, the device for moving the substrate carrier relative to the partition comprises a motor. The substrate can be arranged in the first segment in a first operating state and in the second segment in a second operating state.

Preferably, the substrate carrier is arranged such that it is movable relative to the chamber. The substrate carrier is thus movable relative to the process gas space. In this embodiment, the partition and also the first and second gas feeds are fixedly connected to the chamber.

In one embodiment, the partition is at a distance from the substrate carrier. The distance can have a value of less than 20 mm. As an alternative, the distance can have a value of less than 5 mm. Preferably, the distance can have a value of between 1 mm and 0.1 mm. Advantageously, therefore, exclusively a small gap is present between the substrate carrier and the partition through which at most little exchange of gas between the first segment and the second segment is possible.

In one embodiment, a surface of the substrate carrier and a surface of the substrate are arranged in a common plane. Advantageously, therefore, the partition forms a gap with a constant distance both relative to the substrate carrier and relative to the substrate. On account of the rotation of the substrate carrier, the substrate successively passes through the first segment and the second segment, in which case, upon passing the partition, the gas phase over the substrate is sheared away apart from a small residue.

In one embodiment, the layer depositing device comprises a rotating device for rotating the substrate relative to the substrate carrier. Advantageously, therefore, the substrate is rotated while it is situated in the first segment, for example, with the result that a uniformity of the layer deposition is increased.

In one embodiment, a method for operating a layer depositing device comprises arranging at least one substrate to be coated on a substrate carrier. First process conditions are set in a first segment of a process gas space. Furthermore, second process conditions are set in a second segment of the process gas space. In this case, a partition separates the first segment from the second segment. The substrate is moved relative to the partition.

Advantageously, it is possible to set the first and the second process conditions in the first and in the second segment differently and separately from one another, such that preliminary reactions are reduced. The substrate can be moved by virtue of the substrate carrier being moved.

In one embodiment, in order to set the first process conditions, a first process gas is introduced into the first segment. A second process gas is introduced into the second segment in order to set the second process conditions. The first process gas is preferably different from the second process gas. The partition advantageously reduces mixing of the first process gas in the first segment with the second process gas in the second segment, thereby reducing preliminary reactions of the first process gas with the second process gas.

In one embodiment, an epitaxial layer is deposited on the substrate. The epitaxial layer can be embodied as a compound semiconductor. In this case, the first process gas can comprise a first component of the compound semiconductor and the second process gas can comprise a second component of the compound semiconductor.

The substrate is preferably exposed multiply alternately to the first segment and the second segment of the process gas space. Advantageously, an epitaxial layer can thus be deposited atomic layer by atomic layer. A first exposure time of the substrate in the first segment and a second exposure time of the substrate in the second segment can advantageously be set by defining a rotation duration of a substrate carrier designed for receiving the substrate. What can thus advantageously be achieved is that the substrate is exposed to the first process gas and to the second process gas in each case only for a short duration.

The rotation duration can be less than 30 seconds. The rotation duration can furthermore be less than 0.1 second. Preferably, the rotation duration can be less than 10 seconds.

In one embodiment, the first process gas comprises a first carrier gas and the second process gas comprises a second carrier gas. The first carrier gas can be different from the second carried gas, such that a carrier gas suitable for the respective component of the compound semiconductor can be selected.

The compound semiconductor can be based on a III-V compound semiconductor or on a II-VI compound semiconductor. The III-V compound semiconductor can be based on a nitride compound semiconductor, a phosphide compound semiconductor, an antimonide compound semiconductor, an arsenide compound semiconductor or an alloy thereof.

In the present context, "based on nitride compound semiconductors" means that the active epitaxial layer sequence or at least one layer thereof comprises a nitride III compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which essentially do not change the characteristic physical properties of the $Al_nGa_mIn_{1-n-m}N$ material. For the sake of simplicity, however, the above formula only comprises the essential constituents of the crystal lattice Al, Ga, In, N, even if these can be replaced in part by small quantities of further substances.

In the present context, "based on phosphide compound semiconductors" means that the semiconductor body, in particular the active region, preferably comprises $Al_nGa_mIn_{1-n-m}P$, where $0 \leq n \leq 1$, $0 \leq m \leq 1$ and $n+m \leq 1$ preferably where $n \neq 0$ and/or $m \neq 0$. In this case, this material need not necessarily have a mathematically exact composition according to the above formula. Rather, it can comprise one or more dopants and additional constituents which essentially do not change the characteristic physical properties of the material. For the sake of simplicity, however, the above formula only comprises the essential constituents of the crystal lattice Al, Ga, In, P, even if these can be replaced in part by small quantities of further substances.

In the present context, "based on antimonide compound semiconductors" means that the semiconductor body, in particular the active region, preferably comprises $Al_nIn_mGa_{1-n-m}Sb$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which essentially do not change the characteristic physical properties of the material. For the sake of simplicity, however, the above formula only comprises the essential constituents of the crystal lattice Al, In, Ga, Sb, even if these can be replaced in part by small quantities of further substances.

In the present context, "based on arsenide compound semiconductors" means that the semiconductor body, in particular the active region, preferably comprises $Al_nIn_mGa_{1-n-m}As$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which essentially do not change the characteristic physical properties of the material. For the sake of simplicity, however, the above formula only comprises the essential constituents of the crystal lattice Al, In, Ga, As, even if these can be replaced in part by small quantities of further substances.

In this context, "based on II-VI compound semiconductors" means that the semiconductor body, in particular the active region, comprises a compound composed of at least one component from the second main group of the periodic system, in particular beryllium, magnesium, zinc, cadmium and mercury, with at least one component from the sixth main group, in particular oxygen, sulfur, selenium and tellurium. The II-VI compound semiconductor can preferably comprise $Zn_nCd_{1-n}S_mSe_{1-m}$, where $0 \leq n \leq 1$ and $0 \leq m \leq 1$. In this case, this material need not necessarily have a mathematically exact composition. Rather, it can comprise one or more dopants and additional constituents which essentially do not change the physical properties of the material. For the sake of simplicity, however, the above formula comprises only the essential constituents of the crystal lattice Zn, Cd, S, Se, even if these can be replaced in part by small quantities of further substances. The II-VI compound semiconductors can comprise for example sulfides and/or selenides.

The compound semiconductor can be deposited for producing a light emitting diode, in particular a thin-film light emitting diode chip, a laser, a solar cell or a detector.

The invention is explained in more detail below on the basis of a plurality of exemplary embodiments with reference to the figures. Components and structural parts that are identical functionally and/or in terms of their effect bear identical reference symbols. Insofar as components or structural parts correspond to one another in terms of their functions, their description is not repeated in each of the following figures.

DETAILED DESCRIPTION OF THE DRAWINGS

Figure 1A:
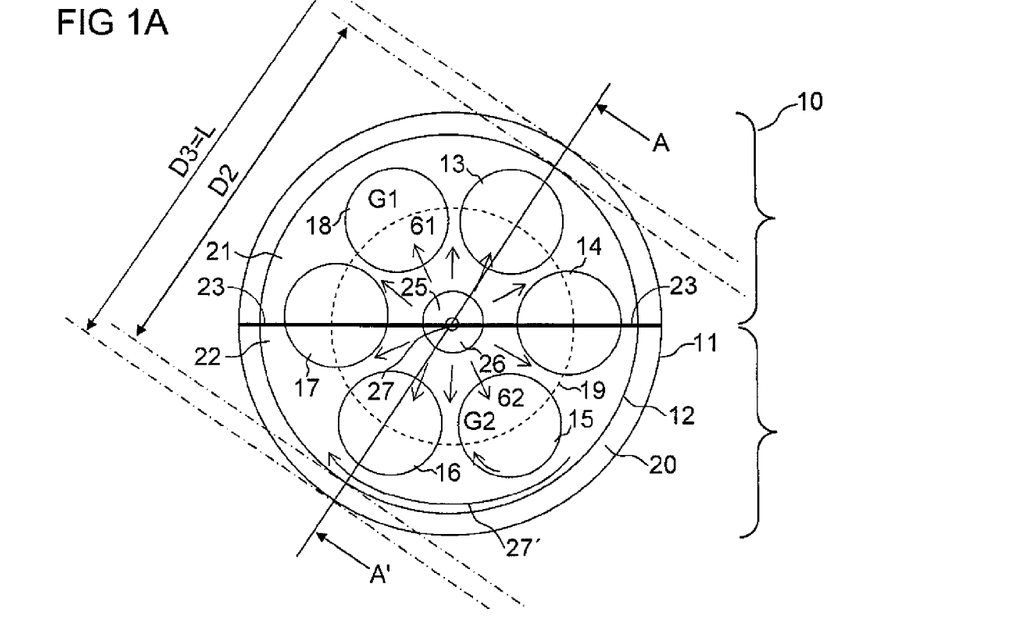
FIGS. 1A to 1F feature an exemplary embodiment of a layer depositing device according to the invention.

FIG. 1A shows an exemplary embodiment of a layer depositing device, in plan view. The layer depositing device comprises a chamber 10 having a process gas space 11 and a substrate carrier 12. The substrate carrier 12 is embodied as a circular plate. A center axis of the process gas space 11 corresponds to an axis of rotational symmetry 27 of the substrate carrier 12. The six substrates 13 to 18 to be coated are arranged on the substrate carrier 12. A midpoint of the first substrate 13 lies on a circular line 19, the midpoint of which lies on the axis of rotational symmetry 27 of the substrate carrier 12. The midpoints of the further substrates 14 to 18 likewise lie on the circular line 19.

The process gas space 11 is embodied substantially cylindrically. A diameter D2 of the substrate carrier 12 is smaller than a diameter D3 of the process gas space 11. Therefore, the chamber 10 has a gap 20 between the substrate carrier 12 and a wall of the process gas space 11. The process gas space 11 comprises a first segment 21 and a second segment 22, which is separated from the first segment by a partition 23. The partition 23 runs through the center axis of the process gas space 11 and through the axis of rotational symmetry 27 of the substrate carrier 12. The partition 23 extends from a section of the wall of the process gas space 11 to an opposite section of the wall of the process gas space 11. A length L of the partition 23 is therefore the diameter D3 of the process gas space 11. Furthermore, the process gas space 11 has a first and a second gas feed 25, 26. The first gas feed 25 has an outlet into the first segment 21. The second gas feed 26 correspondingly has an outlet into the second segment 22. The gap 20 is connected to a vacuum system 24 (not shown in FIG. 1A). The gap 20 serves for extracting gas.

In order to deposit a layer, firstly the chamber 10 is opened. The substrates 13 to 18 to be coated are arranged on the substrate carrier 12. After the chamber 10 has been closed, a vacuum is generated in the process gas space 11 by means of the vacuum system 24. By means of a gas supply system 28 (not shown in FIG. 1A), firstly purge gases are introduced into the first and the second segment 21, 22 of the process gas space 11 via the two gas feeds 25, 26. The substrate carrier 12 is subsequently rotated about the axis of rotational symmetry 27 in accordance with the arrow 27' shown in FIG. 1A. In this case, the partition 23 does not touch the substrate carrier 12 and the substrates 13 to 19. The first substrate 13, which is situated in the first segment 21 in accordance with FIG. 1A is moved into the second segment 22. Furthermore, the first gas feed 25 conducts a first process gas G1 into the first segment 21. The second gas feed 26 correspondingly conducts a second process gas G2 into the second segment 22. A first layer is deposited on the substrate 13 by means of the first process gas G1. After the rotation of the first substrate 13 from the first segment 21 into the second segment 22, a second layer is deposited on the substrate 13 by means of the second process gas G2. The first substrate 13 is situated alternately in the first and in the second segment 21, 22, such that a desired layer sequence is deposited on the first substrate 13. By way of example, a monolayer of atoms of a first component of a compound semiconductor can be deposited by means of the first process gas G1 and a monolayer of atoms of a second component of the compound semiconductor can be deposited by means of the second process gas G2.

Advantageously, by means of the partition it is possible to obtain two segments 21, 22 with different process conditions. High flexibility is thus possible during the deposition of layers. The partition 23 advantageously prevents mixing of the first process gas G1 with the second process gas G2.

In an alternative embodiment (not shown), the substrate carrier 12 is embodied for receiving additional substrates. The additional substrates can be arranged along a further circular line about the axis of rotational symmetry 27 of the substrate carrier 12. The capacity of layer depositing device is thus increased.

In an alternative embodiment (not shown), the substrate carrier 12 is embodied for receiving substrates in such a way that the substrates are not arranged on circular lines. By way of example, the substrates can be arranged in accordance with the principle of closest sphere packing.

In an alternative embodiment (not shown), an individual substrate 13 is arranged on the substrate carrier 12. The substrate 13 can be simultaneously situated in the first and in the second segment 21 and 22. The substrate 13 can have a value for a diameter which is greater than 200 mm. In one embodiment, the substrate carrier 12 can be embodied as a gas cushion on which the substrate 13 floats.

In an alternative embodiment (not shown), the layer depositing device is embodied as an atmospheric pressure reactor. In this case, a slight excess pressure is present in the chamber 10. The excess pressure can assume a value from an interval between 1 mbar and 2 bar.

In an alternative embodiment (not shown), a respective extraction device is present for the segments 21, 22.

Figure 1B:
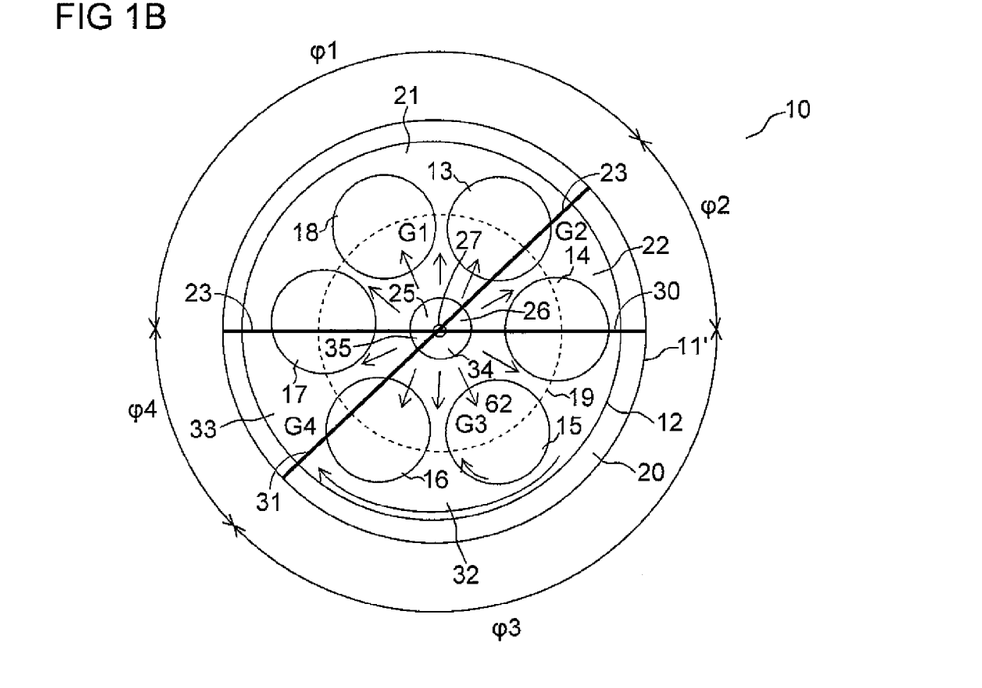

FIG. 1B shows a further exemplary embodiment of a layer depositing device. The layer depositing device in accordance with FIG. 1B is a development of the layer depositing device illustrated in FIG. 1A. In accordance with FIG. 1B, the process gas space 11' comprises a second and a third partition 30, 31, such that the process gas space 11' comprises a third and a fourth segment 32, 33. The four segments 21, 22, 32, 33 have different sizes. Consequently, the cylindrical process gas space 11' is divided into four parts by means of the partitions 23, 30, 31. In this case, an area of the first segment 21 of the cross section shown in FIG. 1B is proportional to a first angle $\phi1$, an area of the second segment is proportional to a second angle $\phi2$, an area of the third segment 32 is proportional to a third angle $\phi3$ and an area of the fourth segment 33 is proportional to a fourth angle $\phi4$. Furthermore, the chamber 10 comprises a third gas feed 34 into the third segment 32 for conducting in a third process gas G3 and a fourth gas feed 35 into the fourth segment 33 for conducting in a fourth process gas G4.

The third gas feed 34 applies the third process gas G3 to the third segment 32. The fourth gas feed G4 correspondingly applies the fourth process gas G4 to the fourth segment 33. In order to deposit a layer, therefore, different gases can be applied to the four segments 21, 22, 32, 33. By way of example, gases containing components of the layer can be applied to the first and the third segment 21, 32, and purge gases can be applied to the second and the fourth segment 22, 33. A purge gas can be nitrogen or argon, for example. The substrate carrier 12 is moved with a rotation duration T. Consequently, the first substrate 13 is situated in the first segment 21 during a first duration T1, which can be referred to as the exposure time, in accordance with the following equation:

$$T1 = \frac{\varphi 1}{360°} \cdot T,$$

where φ1 is an angle of the first segment 21. The partition 23 is arranged on the two legs of the angle φ1. Correspondingly, the first substrate 13 is situated in the second segment 22 for a second time duration T2, in the third segment 30 for a third time duration T3 and in the fourth segment 33 for a fourth time duration T4 in accordance with the following equations:

$$T2 = \frac{\varphi 2}{360°} \cdot T, \; T3 = \frac{\varphi 3}{360°} \cdot T, \; T4 = \frac{\varphi 4}{360°} \cdot T$$

where φ1+φ2+φ3+φ4=360° and T1+T2+T3+T4=T

Advantageously, a mixing of the first process gas G1 situated in the first segment 21 with the third process gas G3 situated in the third segment 32 is reduced further. Advantageously, therefore, the exposure times of the first substrate 13 in the individual segments can be defined by means of the position of the partitions 23, 30, 31. Consequently, the exposure times can be set individually for application of the first process gas G1, for purging after application of the first process gas G1, for application of the third process gas G3 and for purging after application of the third process gas G3. The exposure times T1 to T4 can be for example between 0.01 and 10 seconds.

Figure 1C:
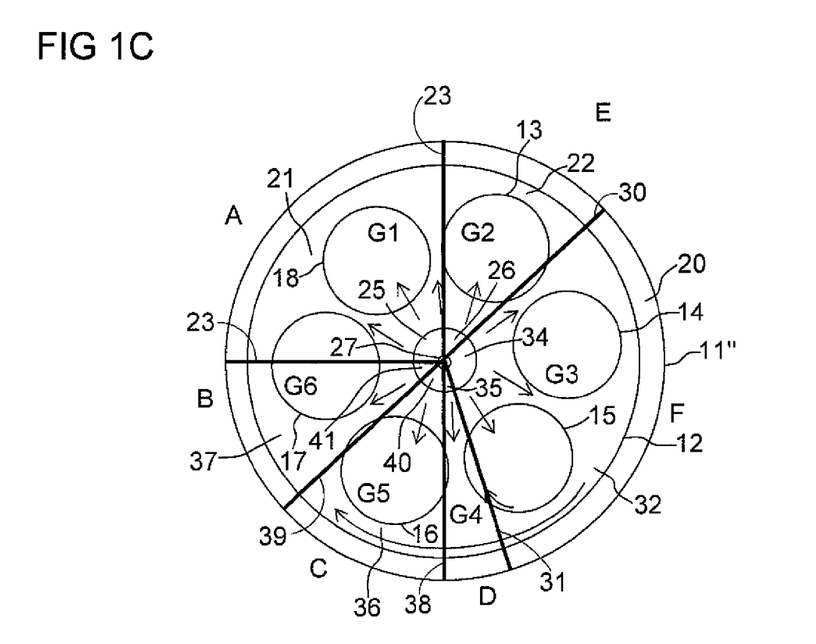

FIG. 1C shows a further exemplary embodiment of a layer depositing device, The layer depositing device in accordance with FIG. 1C is a development of the embodiments illustrated in FIGS. 1A and 1B. The process gas space 11" in accordance with FIG. 1C comprises six segments. The substrate 13 successively passes through the first segment 21, the second segment 22, the third segment 32, the fourth segment 33, a fifth segment 36 and a sixth segment 37. The process gas space 11" thus comprises a fourth and a fifth partition 38, 39. The fourth partition 38 is arranged between the fourth segment 33 and the fifth segment 36 and the fifth partition 39 is arranged between the fifth segment 36 and the sixth segment 37. Furthermore, the chamber comprises a fifth and a sixth gas feed 40, 41 into the fifth and, respectively, into the sixth segment 36, 37.

Consequently, six different process gases G1 to G6 are successively applied to the substrate 13 in the following order:
G1: Group III component of the compound semiconductor comprising hydrogen carrier gas,
G2: Nitrogen carrier gas,
G3: Group V component of the compound semiconductor comprising hydrogen carrier gas,
G4: Hydrogen carrier gas,
G5: Group III component of the compound semiconductor comprising nitrogen carrier gas,
G6: Dopant comprising hydrogen carrier gas.

The six exposure times T1 to T6 for the six different process gases G1 to G6 can be set in accordance with the six angles φ1 to φ6 of the six segments 21, 22, 32, 33, 36, 37.

A mixing of the first and of the fifth process gas G1, G5 comprising the group III component with the third process gas G3 comprising the group V component of the compound semiconductor is advantageously kept small. Different carrier gases can be used for the different components. Likewise, different carrier gases can be used for the same components.

Figure 1D:
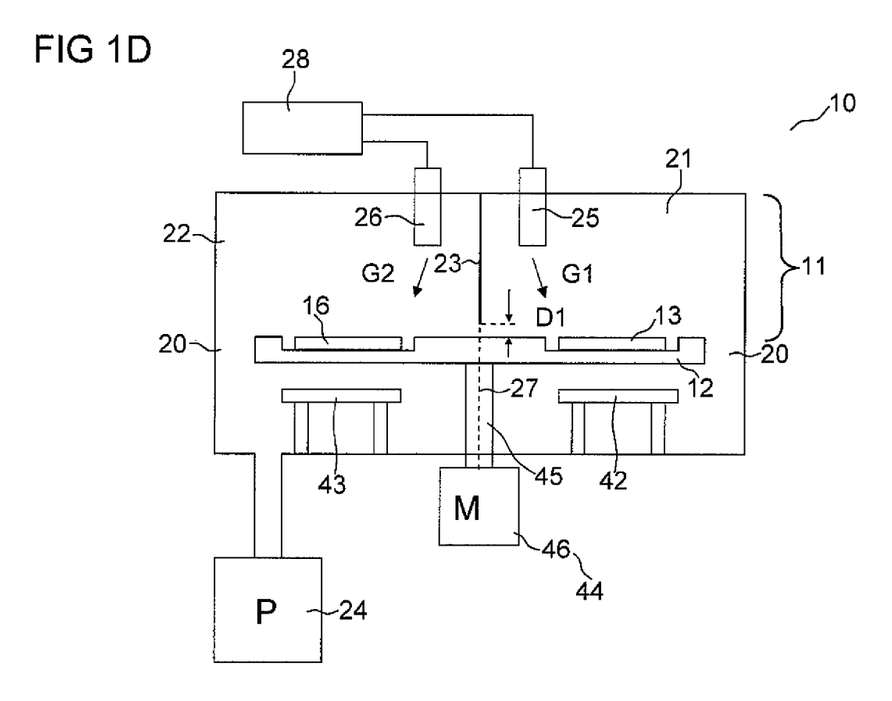

FIG. 1D shows an exemplary embodiment of a layer depositing device in cross section. FIG. 1D shows a cross section along a line AA' indicated in FIG. 1A. The layer depositing device in accordance with FIG. 1D is embodied as a vertical reactor. The layer depositing device is referred to as a vertical reactor since the main direction of the movement of the process gases G1, G2 in the process gas space 11 takes place perpendicular to the substrates 13, 16.

The first and the further substrate 13, 16 lie in depressions in the substrate carrier 12. Consequently, a surface of the substrate carrier 12 and a surface of the substrates 13, 16 approximately form a plane. The process gas space 11 comprising the first and the second segment 21, 22 is arranged above the substrate carrier 12. The first and the second gas feed 25, 26 are arranged opposite the substrate carrier 12. The partition 23 is arranged between the first and the second segment 21, 22. The partition 23 is at a distance D1 from the substrate carrier 12. Furthermore, the chamber 10 has a first heater 42 and a second heater 43. The two heaters 42, 43 are arranged below the substrate carrier 12. The layer depositing device comprises the vacuum system 24 connected to the peripheral gap 20. Furthermore, the layer depositing device has a device 44 for moving the substrate carrier 12 relative to the partition 23. The device 44 comprises a motor 46. A spindle 45 of the motor 46 is connected to the substrate carrier 12. In this case, the axis of rotational symmetry 27 of the substrate carrier 12 corresponds to a center axis of the spindle 45. Furthermore, the layer depositing device comprises a gas supply system 28 connected to the first gas feed 25 and the second gas feed 26 via supply lines.

The substrates 13, 16 are placed onto the substrate carrier 12. The vacuum system 24 generates a vacuum below the substrate carrier 12 and in the process gas space 11. The absolute pressure in the process gas space 11 can be a value from an interval between 1 mbar and 1 bar. By means of the motor 46 and the spindle 47, the substrate carrier 12 can be caused to effect a rotational movement with the rotation duration T. The first and the second heater 42, 43 are provided for heating the substrates 13 to 19. Consequently, the substrates 13 to 19 are at a temperature suitable for the deposition process. The gas supply system 28 provides purge gases for the purging step and the first and the second process gas G1, G2 during the deposition process. In one embodiment, the first process gas G1 comprises a group III precursor and a carrier gas, and the second process gas G2 comprises a group V precursor and a carrier gas. The coating of the substrates 13, 16 is carried out from above. Therefore, a layer depositing device of this type is also referred to as a face-up arrangement.

Figure 1E:
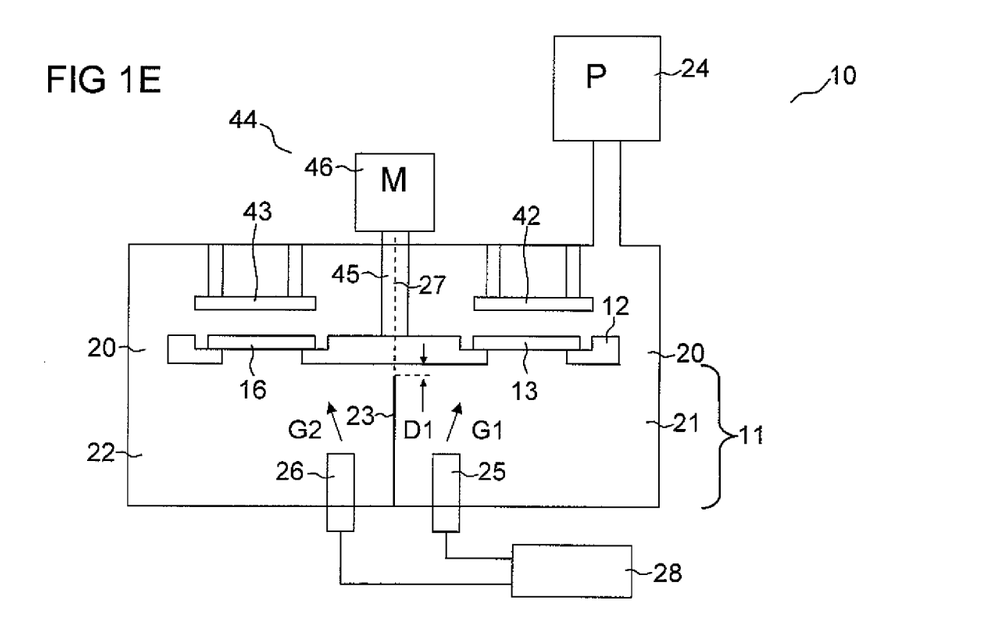

FIG. 1E shows a further exemplary embodiment of a layer depositing device in cross section, which is a further development of the layer depositing device shown in FIG. 1D. The layer depositing device illustrated in FIG. 1E is likewise embodied as a vertical reactor. The substrates 13, 16 are coated from below. The substrate carrier 12 has cutouts on which the substrates 13, 16 lie, such that the substrates 13, 16 can be coated from below through the cutouts. The substrates 13 to 19 are therefore introduced into the substrate carrier 12 with the side to be coated facing downward. Therefore, a layer depositing device of this type is also referred to as a face-down arrangement. The process gas space 11 is therefore arranged below the substrate carrier 12. The further components of the layer depositing device correspond to the components shown in FIG. 1D, the components arranged above the substrate carrier 12 in FIG. 1D being arranged below the substrate carrier 12 in FIG. 1E, and the components arranged below the substrate carrier 12 in FIG. 1D being arranged above the substrate carrier 12 in the layer depositing device in accordance with FIG. 1E. A face-down arrangement prevents possible particles present in the process gas space 11 from impinging on the surfaces of the substrates 13, 16 that are to be coated.

Figure 1F:
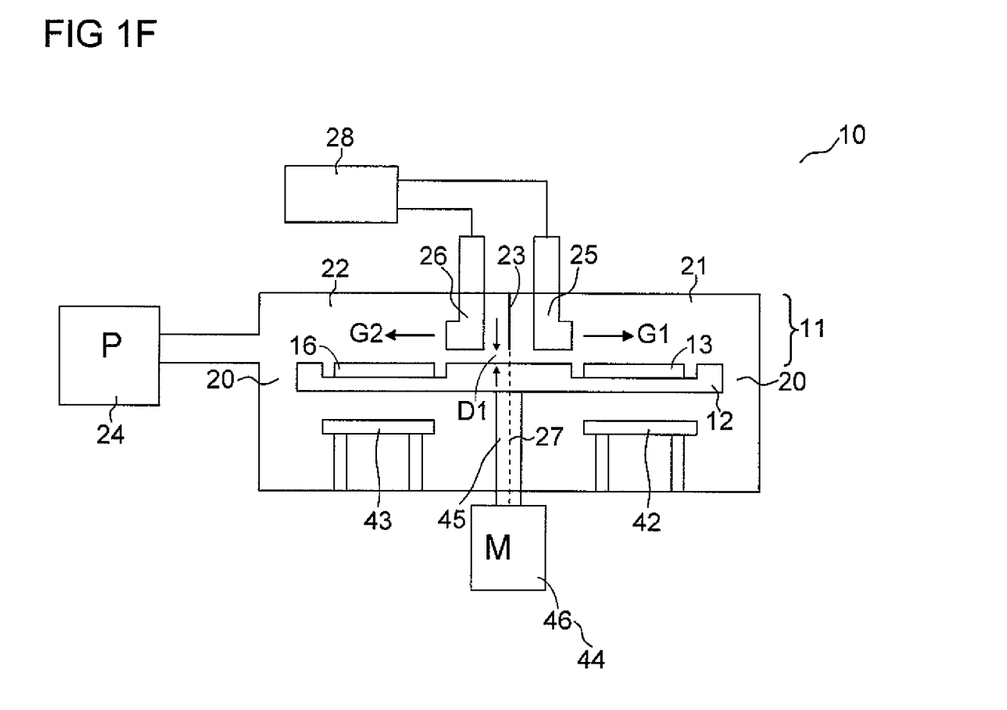

FIG. 1F shows a further exemplary embodiment of a layer depositing device in cross section. The layer depositing device shown in FIG. 1F is a development of the layer depositing device in accordance with FIG. 1D. The layer depositing device shown in FIG. 1F is realized as a horizontal reactor. In this layer depositing device, the main movement of the process gases G1, G2 is effected in a horizontal direction that is to say substantially parallel to the surface of the substrates 13, 16. The horizontal flow is achieved by the arrangement of the gas outlets 25, 26 in direct proximity to the surface of the substrate carrier 12 and by the extraction of from the process gas space 11 at the edge of the chamber 10. The layer depositing device is realized as a face-up arrangement.

Figure 2:
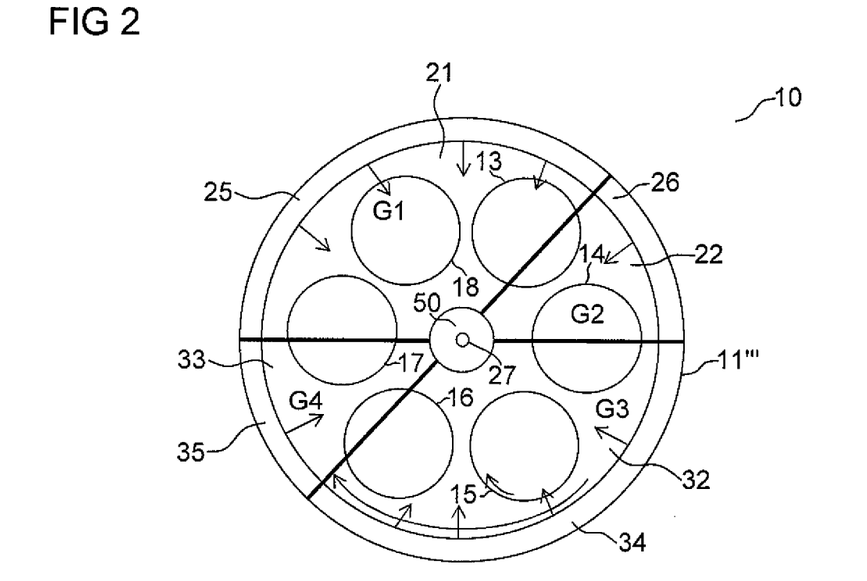
FIG. 2 shows an alternative exemplary embodiment of a layer depositing device according to the invention.

FIG. 2 shows a further exemplary embodiment of a layer depositing device. FIG. 2 shows a development of the embodiment illustrated in FIG. 1B. In accordance with FIG. 2, provision is made of an opening 50 for the gas extraction in the center of the process gas space 11'''. The first gas feed 25 is arranged at the wall of the process gas space 11 in the first segment 21. The second, the third and the fourth gas feed 26, 34, 35 are correspondingly arranged at the wall of the process gas space 11''' in the second, third and fourth segments 22, 32, 34. Consequently, the process gases G1 to G4, proceeding from the wall of the process gas space 11''', move laterally over the substrates 13 to 19 right into the center of the process gas space 11''', where they are extracted by means of the opening 50 leading to the vacuum system 24.

Consequently, in FIG. 2 the flow direction of the process gases G1 to G4 is reversed relative to the embodiment in FIG. 1B.

Figure 3A:
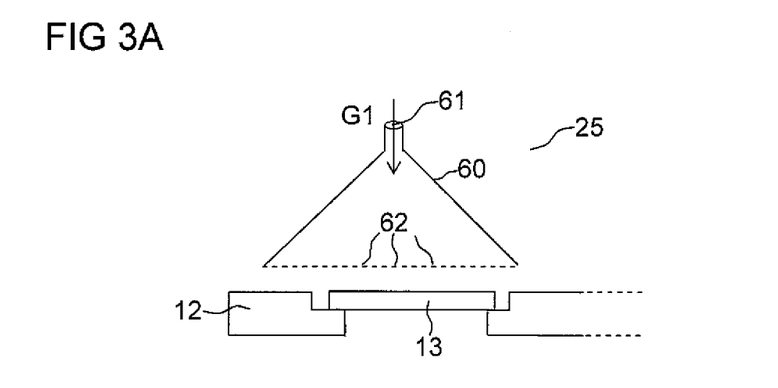
FIGS. 3A to 3D show exemplary components of a layer depositing device according to the invention.

FIG. 3A shows an exemplary embodiment of a gas feed. The gas feed 25 comprises a gas distribution device 60 with an inlet 61 and a plurality of outlets 62. The outlets 62 are arranged opposite the substrate carrier 12. The distance between the gas distribution device 60 and the substrate carrier 12 is small. The distance is 1 cm, for example. The outlets 62 are arranged opposite that region of the substrate carrier 12 in which the various substrates 13 to 19 are successively situated.

A high homogeneity of the gas concentration over the substrate 13 and hence a high homogeneity of the layer deposition are advantageously obtained by means of the gas distribution device 60.

Figure 3B:
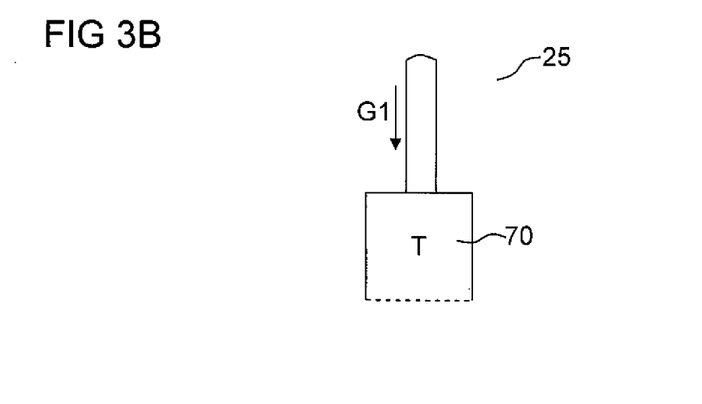

FIG. 3B shows an exemplary alternative embodiment of a gas feed. The gas feed 25 comprises a pyrolysis device 70. The pyrolysis device 70 has a heating source. The process gas is pyrolytically decomposed by the pyrolysis device 70.

Consequently, it is advantageously possible to carry out a pre-decomposition of the process gas G1 before the process gas G1 is actually applied to the substrate 13.

Figure 3C:
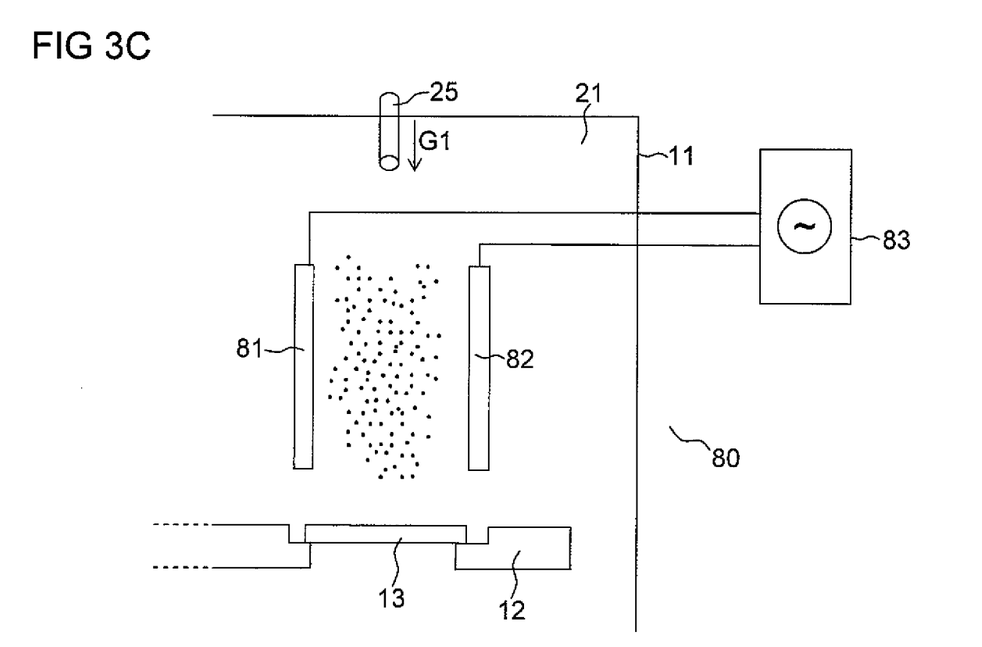

FIG. 3C shows an exemplary embodiment of a segment with a device 80 for generating a plasma. The device 80 has a first and a second electrode 81, 82. The two electrodes 81 and 82 are connected to an AC voltage generator 83 arranged outside the chamber 10.

By applying an AC voltage to the two electrodes 81, 82, a plasma is generated between the two electrodes 81, 82 and thus in the segment. Components of the process gas G1 of the segment are pre-decomposed by means of the plasma. Consequently, the segment is embodied for plasma epitaxy.

The plasma can be generated near the substrates 13 to 18, in particular at a distance of 0.5 to 2 cm, or removed from the substrates 13 to 18 in the process gas space 11.

It is advantageously possible to effect a reaction of the process gas G1 by means of the plasma prior to actual impingement on the substrate.

In an alternative embodiment, the plasma can be generated in one of the gas feeds 25, 26, 34, 35, 36, 37 or in a prechamber disposed upstream of the chamber 10.

Figure 3D:
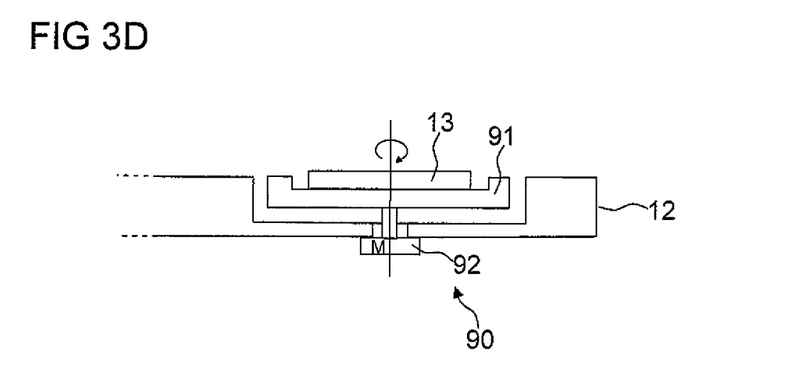

FIG. 3D shows an exemplary embodiment of a substrate carrier. In accordance with FIG. 3D, the substrate carrier 12 comprises a rotating device 90. The rotating device 90 has a turntable 91 for receiving the substrate 13. Furthermore, the rotating device 90 comprises a motor 92, the spindle of which is connected to a rotation spindle of the turntable 91.

Advantageously, therefore, the substrate 13 can be rotated about the axis of the turntable 91 and thus about the midpoint of the substrate 13 during the deposition process. A uniformity of the layer deposition on the substrate 13 is thus advantageously increased.

In an alternative embodiment (not shown), the turntable 91 comprises receptacles for a plurality of substrates. The capacity of the layer depositing device can thus increased further.

In an alternative embodiment (not shown), the drive is effected without a motor. The drive can be produced by means of a flow in the gas cushion on which the substrate or substrates 13 or on which the substrate carrier 12 floats.

The invention is not restricted by the description on the basis of the exemplary embodiments. Rather the invention encompasses any new feature and also any combination of features, which in particular comprises any combination of features in the patent claims, even if this feature or this combination itself is not explicitly specified in the patent claims or exemplary embodiments.

I claim:

1. A layer depositing device comprising:
   a chamber having
     a substrate carrier for receiving at least one substrate to be coated, the substrate carrier including cutouts on which at least one substrate lies such that the at least one substrate is coatable from below the cutouts, and
     a process gas space, comprising six partitions that separate the process gas space into six segments; and
     a device for moving the at least one substrate relative to the partitions;
   wherein the substrate is arranged to perform a rotational movement;
   wherein the at least one substrate is mounted on the topside of the substrate carrier such that the process gas passes through the cutouts formed therein to coat a back side of the at least one substrate;
   wherein the process gas space is arranged below the substrate carrier;
   wherein the process gas space comprises a first gas feed for conducting in a first process gas G1 into the first segment, a second gas feed for conducting in a second process gas G2 into the second segment, a third gas feed for conducting in a third process gas G3 into the third segment, a fourth gas feed for conducting in a fourth process gas G4 into the fourth segment, a fifth gas feed for conducting in a fifth process gas G5 into the fifth segment, and a sixth gas feed for conducting in a sixth process gas G6 into the sixth segment;

wherein each of the six segments has a different size, so that the at least one substrate has different exposure times in the individual segments;

wherein the device is configured to pass the substrate, in order, through the first segment, the second segment, the third segment, the fourth segment, the fifth segment and the sixth segment;

wherein said first gas feed includes a gas source for said first process gas G1, which is a Group III component of the compound semiconductor and a carrier gas, wherein said second gas feed includes a gas source for said second process gas G2, which is a Nitrogen carrier gas, wherein said third gas feed includes a gas source for said third process gas G3, which is a Group V component of the compound semiconductor and a carrier gas, wherein said fourth gas feed includes a gas source for said fourth process gas G4, which is a Hydrogen carrier gas, wherein said fifth gas feed includes a gas source for said fifth process gas G5, which is a Group III component of the compound semiconductor and a carrier gas, and wherein said sixth gas feed includes a gas source for said sixth process gas G6, which is a dopant and a carrier gas.

2. The layer depositing device as claimed in claim 1, wherein the layer depositing device comprises an epitaxial layer depositing device.

3. The layer depositing device as claimed in claim 1, wherein the substrate carrier comprises a circular plate.

4. The layer depositing device as claimed in claim 3, wherein the substrate carrier is arranged such that the substrate carrier is rotatable relative to the process gas space about an axis that is the axis of rotational symmetry of the circular plate.

5. The layer depositing device as claimed in claim 1, wherein the device for moving the at least one substrate relative to the partitions comprises a motor such that the substrate is arranged in the first segment in a first operating state and in the second segment in a second operating state.

6. The layer depositing device as claimed in claim 1, wherein at least one partition is at a distance D1 from the substrate carrier.

7. The layer depositing device as claimed in claim 6, wherein the distance D1 has a value of less than 5 mm.

8. The layer depositing device as claimed in claim 1, wherein at least one of the gas feeds comprises a gas distribution device having a plurality of outlets for distributing a process gas in the corresponding segment.

9. The layer depositing device as claimed in claim 1, further comprising a pre-decomposition stage for decomposing a process gas.

10. The layer depositing device as claimed in claim 9, wherein the pre-decomposition stage comprises a pyrolysis device.

11. The layer depositing device as claimed in claim 9, wherein the pre-decomposition stage comprises a device for generating a plasma.

12. The layer depositing device as claimed in claim 1, wherein the at least one substrate is mounted via the force of gravity.

13. The layer depositing device as claimed in claim 1, wherein the partitions comprise a material which is thermally stable up to a temperature of 2000 degrees Celsius.

14. The layer depositing device as claimed in claim 1, wherein the compound semiconductor is a III-V compound semiconductor.

* * * * *